United States Patent
Geiger

(10) Patent No.: US 10,679,976 B2
(45) Date of Patent: Jun. 9, 2020

(54) COMPACT OPTOELECTRONIC MODULES

(71) Applicant: ams Sensors Singapore Pte. Ltd., Singapore (SG)

(72) Inventor: Jens Geiger, Thalwil (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 102 days.

(21) Appl. No.: 15/713,946

(22) Filed: Sep. 25, 2017

(65) Prior Publication Data

US 2018/0026020 A1    Jan. 25, 2018

Related U.S. Application Data

(62) Division of application No. 15/037,392, filed as application No. PCT/SG2014/000543 on Nov. 18, 2014, now Pat. No. 9,773,765.

(Continued)

(51) Int. Cl.
*H01L 25/16*  (2006.01)
*H01L 27/146*  (2006.01)
(Continued)

(52) U.S. Cl.
CPC .......... *H01L 25/167* (2013.01); *G01S 7/4813* (2013.01); *H01L 24/97* (2013.01);
(Continued)

(58) Field of Classification Search
CPC ....... H01L 33/44; H01L 33/46; H01L 25/167; H01L 24/97; H01L 33/58; H01L 27/1462;
(Continued)

(56) References Cited

U.S. PATENT DOCUMENTS 5,566,265 A    10/1996  Spaeth et al.
5,912,872 A *  6/1999  Feldman ................ G11B 7/123
                                                         369/103

(Continued)

FOREIGN PATENT DOCUMENTS

CN         1875617 A       12/2006
EP       2 472 294 A1       7/2012
(Continued)

OTHER PUBLICATIONS

Australian Patent Office, Written Opinion and International Search Report for International Patent Application PCT/SG2014/000543, dated Apr. 9, 2015.

(Continued)

*Primary Examiner* — Tuan A Hoang
(74) *Attorney, Agent, or Firm* — Michael Best & Friedrich LLP

(57) ABSTRACT

Compact optoelectronic modules are described that, in some implementations, can have reduced heights, while at the same time having very little optical crosstalk or detection of stray light. An optoelectronic module having optical channel can include a support on which is mounted an optoelectronic device arranged to emit or detect light at a particular one or more wavelengths. The module has a cover including an optically transmissive portion over the optoelectronic device. The optically transmissive portion is surrounded laterally by sections of the cover that are substantially non-transparent to the one or more wavelengths. A passive optical element is present on a surface of the optically transmissive portion. A spacer separates the support from the cover. The cover can be relatively thin so that the overall height of the module is relatively small.

6 Claims, 6 Drawing Sheets

Related U.S. Application Data

(60) Provisional application No. 61/907,485, filed on Nov. 22, 2013.

(51) Int. Cl.

| | |
|---|---|
| *G01S 7/481* | (2006.01) |
| *H01L 31/0232* | (2014.01) |
| *H01L 31/167* | (2006.01) |
| *H01L 23/00* | (2006.01) |
| *H01L 33/44* | (2010.01) |
| *H01L 33/48* | (2010.01) |
| *H01L 25/00* | (2006.01) |
| *H01L 31/173* | (2006.01) |

(52) U.S. Cl.
CPC ........ *H01L 25/50* (2013.01); *H01L 27/14618* (2013.01); *H01L 31/02325* (2013.01); *H01L 31/167* (2013.01); *H01L 31/173* (2013.01); *H01L 33/44* (2013.01); *H01L 33/486* (2013.01); *H01L 2924/0002* (2013.01); *H01L 2924/12041* (2013.01); *H01L 2924/12042* (2013.01); *H01L 2924/12043* (2013.01); *H01L 2924/12044* (2013.01)

(58) Field of Classification Search
CPC ......... H01L 27/14623; H01L 27/14627; H01L 27/14629
See application file for complete search history.

(56) References Cited

U.S. PATENT DOCUMENTS

| | | | |
|---|---|---|---|
| 6,906,750 B2 | 6/2005 | Hsu et al. | |
| 7,112,864 B2 | 9/2006 | Tsukamoto et al. | |
| 7,638,864 B2 | 12/2009 | Wu et al. | |
| 7,687,989 B2 | 3/2010 | Cok | |
| 7,928,458 B2 | 4/2011 | Lin et al. | |
| 8,107,006 B2 | 1/2012 | Sekimoto et al. | |
| 8,310,584 B2 | 11/2012 | Li | |
| 8,605,211 B2 | 12/2013 | Webster et al. | |
| 8,704,262 B2 | 4/2014 | Livesay et al. | |
| 9,465,442 B2 | 10/2016 | Rai et al. | |
| 2001/0013756 A1 | 8/2001 | Mori et al. | |
| 2006/0044450 A1* | 3/2006 | Wolterink ............ | G02B 13/006 348/340 |
| 2007/0126912 A1 | 6/2007 | De Bruin et al. | |
| 2007/0147816 A1 | 6/2007 | Humpston et al. | |
| 2008/0061392 A1* | 3/2008 | Yen ...................... | H01L 25/167 257/433 |
| 2008/0175605 A1 | 7/2008 | Sakurai | |
| 2008/0290435 A1* | 11/2008 | Oliver ............. | B29D 11/00375 257/432 |
| 2009/0130791 A1 | 5/2009 | Kwon et al. | |
| 2009/0155949 A1 | 6/2009 | Farnworth et al. | |
| 2009/0256931 A1* | 10/2009 | Lee ................... | H01L 24/97 348/231.99 |
| 2010/0032781 A1* | 2/2010 | Ryu .................. | H01L 27/14618 257/432 |
| 2010/0045963 A1* | 2/2010 | Yamaguchi .......... | G01B 11/026 356/4.01 |
| 2010/0096986 A1 | 4/2010 | Tsujita et al. | |
| 2011/0032409 A1* | 2/2011 | Rossi ..................... | G02B 5/005 348/340 |
| 2011/0050979 A1* | 3/2011 | Rudmann ......... | H01L 27/14623 348/335 |
| 2011/0260176 A1* | 10/2011 | Onoe ................... | A61B 5/0261 257/79 |
| 2012/0104454 A1* | 5/2012 | Coffy ..................... | G02B 7/025 257/100 |
| 2012/0154918 A1* | 6/2012 | Murayama ............. | G02B 1/113 359/601 |
| 2012/0307139 A1* | 12/2012 | Cheng ..................... | G02B 7/02 348/374 |
| 2013/0019461 A1* | 1/2013 | Rudmann ............. | H01L 25/167 29/592.1 |
| 2013/0264586 A1 | 10/2013 | Rudmann et al. | |
| 2015/0018611 A1* | 1/2015 | Lei .......................... | H01L 27/15 600/109 |
| 2015/0243802 A1* | 8/2015 | Fujimoto .......... | H01L 31/02327 257/82 |
| 2015/0325613 A1 | 11/2015 | Rudmann et al. | |
| 2015/0340351 A1 | 11/2015 | Rossi et al. | |
| 2015/0340566 A1* | 11/2015 | Butterworth ........ | H01L 33/0079 257/98 |
| 2016/0247976 A1 | 8/2016 | Rudmann et al. | |

FOREIGN PATENT DOCUMENTS

| | | |
|---|---|---|
| JP | 2002247288 A | 8/2002 |
| JP | 2010056292 A | 3/2010 |
| TW | 200947007 A | 11/2009 |
| WO | 2010/074743 | 7/2010 |
| WO | 2011/049635 | 4/2011 |
| WO | 2013/026175 | 2/2013 |
| WO | WO 2013/151507 | 10/2013 |
| WO | 2013/172786 | 11/2013 |

OTHER PUBLICATIONS

Intellectual Property Office of Singapore, Written Opinion in Singapore Application No. 11201603351T, 8 pages (dated Mar. 20, 2017).

* cited by examiner

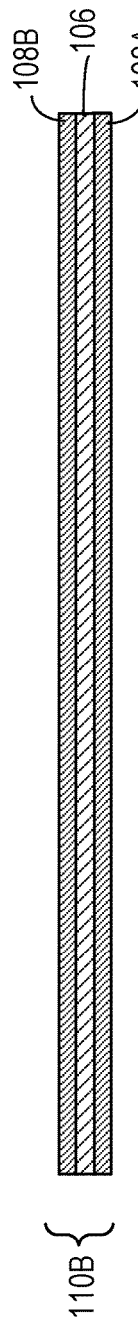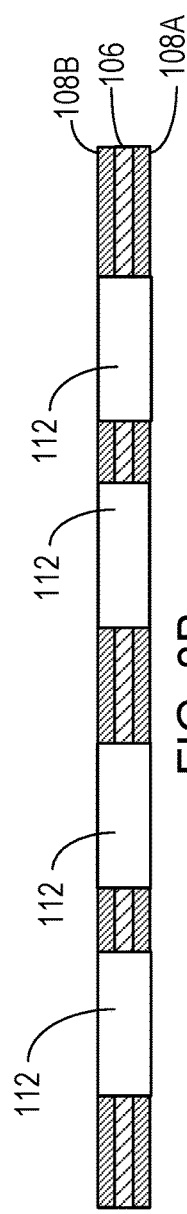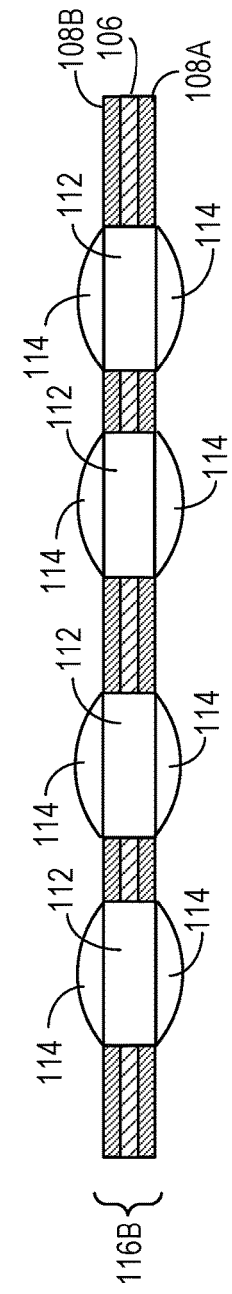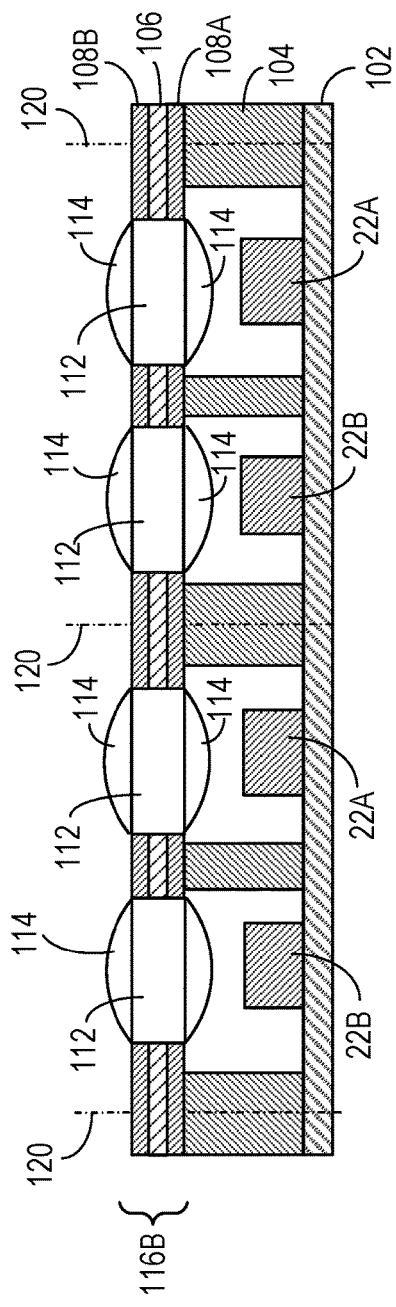

COMPACT OPTOELECTRONIC MODULES

CROSS-REFERENCE TO RELATED APPLICATION(S)

This application is a divisional of U.S. application Ser. No. 15/037,392, filed on May 18, 2016, which is the National Stage of International Application No. PCT/SG2014/000543, filed on Nov. 18, 2014, which claims the benefit of priority U.S. Application No. 61/907,485, filed on Nov. 22, 2013. The disclosure of the prior applications is incorporated herein by reference.

TECHNICAL FIELD

This disclosure relates to optoelectronic modules such as optical proximity sensor modules, ambient light sensors and flash modules, among others.

BACKGROUND

Smartphones and other devices sometimes include miniaturized optoelectronic modules such as light modules, sensors or cameras. More generally, various optoelectronic modules may be integrated into a wide range of small electronic devices, such as bio devices, mobile robots, surveillance cameras, camcorders, laptop computers, and tablet computers, among others. For example, an optical proximity sensor can be provided in a mobile phone or other handheld device to detect the position or location of an object. Likewise, ambient light sensors can be provided to detect the light conditions surrounding the mobile device, for example, to adjust display brightness. Light emitting module such as flash modules can be provided as well. Space, however, often is at a premium in such devices. Thus, it is desirable to make the optoelectronic modules as small and compact as feasible. Other issues that can arise in designing small optoelectronic modules such as optical proximity sensors and ambient light sensors relate to optical crosstalk between channels and the detection of stray light by the module. Light tight packaging also can be desirable to avoid light leakage in light emitting modules.

SUMMARY

Compact optoelectronic modules are described that, in some implementations, can have reduced heights, while at the same time having very little optical crosstalk or detection of stray light.

For example, in one aspect, an optoelectronic module having optical channel includes a support on which is mounted an optoelectronic device arranged to emit or detect light at a particular one or more wavelengths. The module has a cover including an optically transmissive portion over the optoelectronic device. The optically transmissive portion is surrounded laterally by sections of the cover that are substantially non-transparent to the one or more wavelengths. A passive optical element is present on a surface of the optically transmissive portion. A spacer separates the support from the cover.

The cover can be relatively thin so that the overall height of the module is relatively small. For example, in some implementations, the thickness of the cover is no more than 150 µm and can result in a module whose height is no more than 750 µm. Different dimensions may be applicable for other implementations.

In some implementations, the non-transparent sections of the cover is composed, for example, of a PCB, polymer or ceramic layer, which can have a coating of a non-transparent material on a least one side. In some cases the coating is composed of a metal or polymer. The thickness of the coating can, in some instances, be as small as 20 µm and, in some cases, no more than 1 µm. In some cases, for example, where the non-transparent sections of the cover are composed of a carbon-fiber-reinforced polymer, the coating can be omitted; in some implementations, it may still be desirable to include the coating.

The foregoing features can be incorporated into both single channel and multi-channel modules. In addition, wafer-level fabrication techniques are described to facilitate the manufacture of multiple modules.

The details of one or more implementations are set forth in the accompanying drawings and the description below. Other aspects, features, and advantages will be apparent from the description and drawings, and from the claims.

DESCRIPTION OF DRAWINGS

FIGS. 8A-8D illustrates steps in a wafer-level fabrication process for making modules as shown in FIG. 7.

DETAILED DESCRIPTION

Figure 1:
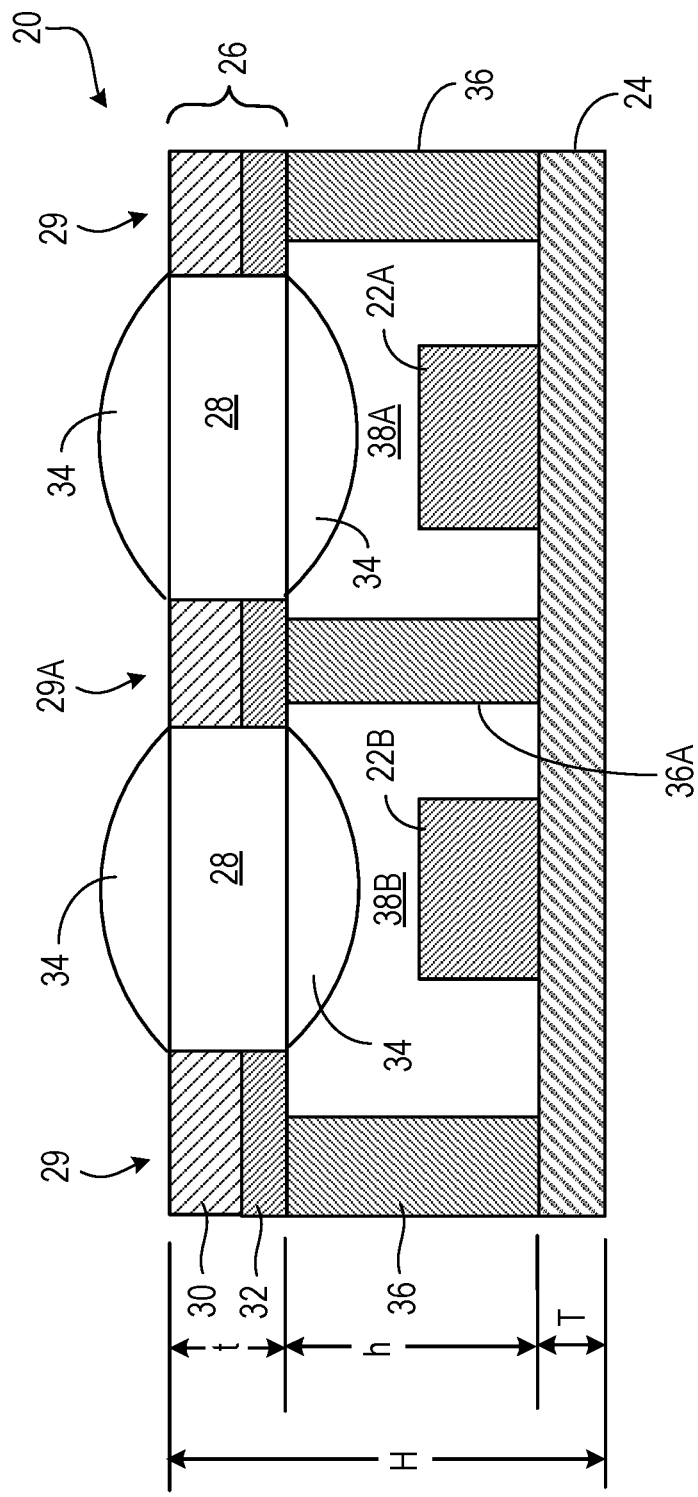
FIG. 1 illustrates an example of an optoelectronic module according to the invention.

As illustrated in FIG. 1, a module 20 includes first and second optoelectronic devices 22A, 22B mounted on a printed circuit board (PCB) or other support substrate 24. In the illustrated example, the first optoelectronic device 22A includes a light emitting element such as a LED, an IR LED, an OLED, an IR laser or a VCSEL. The second optoelectronic device 22B includes a light detecting element such as a photodiode, CCD or other light sensor that is arranged to detect light at one or more wavelengths (e.g., infra-red) emitted by the light emitting device. Although the illustrated module 20 has two channels, one for light emission and one for light detection, the light tight packaging techniques described here also can be used for single channel modules such as ambient light sensors or light emitting modules.

The devices 22A, 22B are protected by a cover 26 that serves as the top of the module. Transmissive portions 28 of the cover 26 that are aligned, respectively, with the module's optical emission and detection channels 38A, 38B are composed of a material (e.g., glass, sapphire or a polymer) that is transparent to the wavelength(s) of light emitted by the light emitting device 22A and detectable by the light detecting device 22B. The transmissive portions 28 of the cover 26 are embedded within sections 29, 29A of the cover 26 that preferably are substantially non-transparent to the particular wavelength(s) of light emitted by the light emitting device 22A and detectable by the light detecting device 22B (e.g., infra-red or near infra-red). Furthermore, the transmissive portions 28 are separated from one another by one of the non-transparent sections 29A.

In some implementations, the non-transparent sections 29, 29A of the cover 26 is composed, for example, of a layer 30 that has a thin non-transparent material layer (e.g., coating) 32 on at least one side. The coating 32 can be composed, for example, of a metal or polymer material that is substantially opaque to the particular wavelength(s) of light emitted by the light emitting device 22A and detectable by the light detecting device 22B. Suitable metals for the coating 32 include, for example, copper or chrome. In some implementations, the metal surface is oxidized to obtain a dark or black surface. Examples of suitable polymers for the coating 32 include non-transparent photoresists, such as PMMA (poly(methyl methacrylate), phenol formaldehyde resin, or epoxy based photoresists. In the example of FIG. 1, the coating 32 is disposed on the device-side of the layer 30. In other implementations, the coating 32 can be disposed on the opposite side of the layer 30. In yet other implementations, non-transparent metal or polymer coatings can be provided on both sides of the layer 30 (cf. FIG. 4, discussed below). The non-transparent sections 29, 29A of the module's cover can help reduce the amount of stray light that is detected by the light detecting device 22B and the amount of optical cross-talk between the channels 38A, 38B.

Preferably, the material for the layer 30 itself is substantially non-transparent to the wavelengths(s) of light emitted by the light emitting device 22A and detectable by the light detecting device 22B. For example, the layer 30 can be composed of a PCB, polymer or ceramic layer 30. Examples of suitable PCB materials include G10 and FR4, which are grade designations assigned to glass-reinforced epoxy laminate materials. At a thickness of about 300-400 microns (µm), such materials can be substantially non-transparent, for example, to infra-red (IR) radiation. On the other hand, at smaller thicknesses (e.g., on the order of about 150 µm or less), such materials may allow some IR light to pass through. Adding a thin non-transparent coating 32 on at least one side of the layer 30 allows the overall thickness (t) of the cover to be relatively small, and yet remain substantially non-transparent to light emitted by the light emitting device 22A and detectable by the light detecting device 22B. In some implementations, the thickness of the coating 32 is less than 20 µm. For example, a coating of 0.5 µm-20 µm can be used. In some implementations, the thickness of the metal coating is in the range of 5-15 µm. In other implementations, a very thin film (e.g., of photoresist) having a thickness in the range of 0.5-1.0 µm can be provided. Using such a relatively thin coating 32 can result in cover 26 having an overall thickness (t) in the range of 100-150 µm. The relatively thin cover 26 can result in a module 20 having a small overall height.

In some implementations, the cover 26 can have a thickness of 150 µm or less (e.g., in the range of 100-150 µm), and yet the non-transparent portions 29, 29A of the cover 26 be composed of a material that is sufficiently non-transparent to light at the particular wavelength(s) such that a coating 32 is not needed. For example, the non-transparent portions 29, 29A can be composed of a carbon-fiber-reinforced polymer. Although in some cases, it may be still be desirable to provide a coating 32 one or both sides of the carbon-fiber-reinforced polymer layer, in other cases, the coating can be omitted.

In general, the thickness of the transmissive portions 28 of the cover 26 should have about the same thickness as the non-transparent sections 29, 29A. In some implementations, optical elements 34 such as lenses or diffusers are disposed on one or both of the top and bottom sides of each transmissive portion 28 of the cover 26. As shown in FIG. 1, a first pair of lenses 34 is aligned with the optical emission channel 38A, and a second pair of lenses 34 is aligned with the optical detection channel 38B. The optical elements 34 can be formed, for example, by a replication technique (e.g., such as etching, embossing or molding).

The cover 26 is separated from the substrate 24 by a spacer 36. The spacer 36 preferably is composed of a non-transparent material, which surrounds the optoelectronic devices 22A, 22B laterally and serves as sidewalls for the module 20. Furthermore, a portion 36A of the spacer 36 serves as an interior wall that separates the emission and detection channels 38A, 38B from one another. The portion 36A of the spacer that serves as the interior wall can be disposed directly below the non-transparent section 29A of the module's cover 26. As noted above, these features can help reduce optical cross-talk between the channels 38A, 38B and can help reduce the amount of stray light entering the module. In some implementations, a baffle is provided over the cover 26 to reduce stray light and/or optical cross-talk even further. In some implementations, the thickness of the baffle is about 100 µm or less.

The optoelectronic devices 22A, 22B can be mounted to the substrate 24, for example, using flip chip technology or wire bonding technology. In some implementations, the underside of the devices 22A, 22B can include conductive contacts that electrically couple the optoelectronic devices 22A, 22B to conductive pads on the surface of the PCB substrate 24. The PCB substrate 24, in turn, can include plated conductive vias that extend from the conductive pads vertically through the substrate 24 and that are coupled to one or more solder balls or other conductive contacts on the exterior side of the substrate 24. The conductive contacts on the exterior of the substrate allow the module 20 to be mounted, for example, on a printed circuit board in a handheld device such as a mobile phone, tablet or other consumer electronic device.

The foregoing module can be made relatively compact with a relatively small footprint. Further, the overall height can be made relatively small. For example, in some implementations, the overall height (H) of the module (i.e., the combined height of the support 24, the height of the spacer 36, the height of the cover 26, and the height of the baffle, if present; but not including any lenses 34 on the exterior side of the cover 26) can be on the order of about 750 µm, or less. As a particular example, the thickness (T) of the substrate 24 can be about 150 µm, the height (h) of the spacer 36 can be about 400 µm, the thickness (t) of the cover 26 can be about 100 µm, and the thickness of the baffle can be about 100 µm. Different dimensions may be appropriate for other implementations. Such small, compact modules can be particularly advantageous for mobile phones and other devices in which space is at a premium.

Modules such as the one illustrated in FIG. 1 and described above can be fabricated, for example, in a wafer-level process. Wafer-level processes allow multiple modules 20 can be fabricated at the same time. Generally, a wafer refers to a substantially disk- or plate-like shaped item, its extension in one direction (y-direction or vertical direction) is small with respect to its extension in the other two directions (x- and z- or lateral directions). In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. In some implementations of a wafer level process, there can be provisions for at least ten modules in each lateral direction, and in some cases at least thirty or even fifty or more modules in each lateral direction.

Figure 2A:
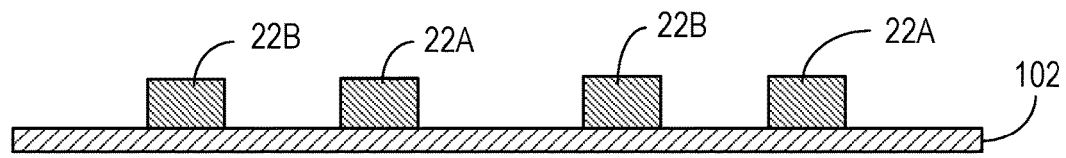
FIGS. 2A-2B, 3A-3C and 4 illustrates steps in a wafer-level fabrication process for making modules as shown in FIG. 1.
Figure 2B:
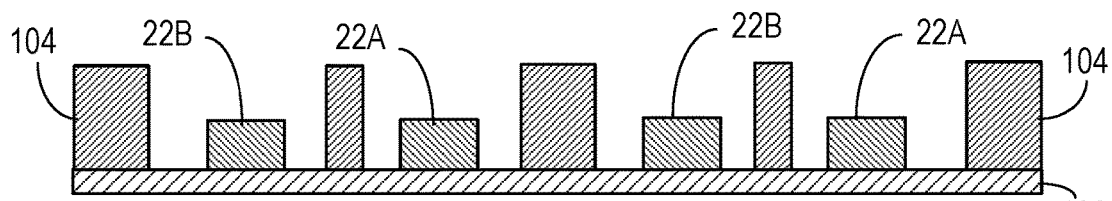

As part of the fabrication process, multiple optoelectronic devices 22A, 22B can be mounted (e.g., by pick-and-place equipment) on a PCB or other support wafer 102 (see FIG. 2A). In some implementations, an array of devices 22 is mounted on the PCB support wafer 102, with each light emitting device 22A mounted adjacent to a light detecting device 22B. A spacer wafer 104 then can be attached, for example, to the device-side of the PCB support wafer 102 (FIG. 2B). Alternatively, the spacer wafer 104 can be attached to optics wafer 116 described below. In some implementations, the spacer wafer 104 is made of a UV- or thermally-curing epoxy (or other polymer) containing carbon black or other dark pigment. Various polymer materials (e.g., epoxy resin, acrylate, polyurethane, or silicone materials) can be used as the base material for the spacer wafer 104, with the addition of one or more pigments or other adhesives to reduce the optical transmission characteristics of the spacer wafer at the wavelength(s) of interest (i.e., the wavelength(s) of light emitted by the device 22A). The spacer wafer 104 includes openings that correspond to the locations for the optical emission and detection channels. The spacer wafer 104 thus surrounds each of the devices 22A, 22B laterally, with a portion of the spacer wafer separating adjacent devices 22A, 22B from one another. In some implementations, instead of a separate spacer wafer 104, spacers can be formed, for example, on the device-side of the PCB support wafer 102 or on the optics wafer 116 by a replication or vacuum injection molding technique.

Figure 3A:
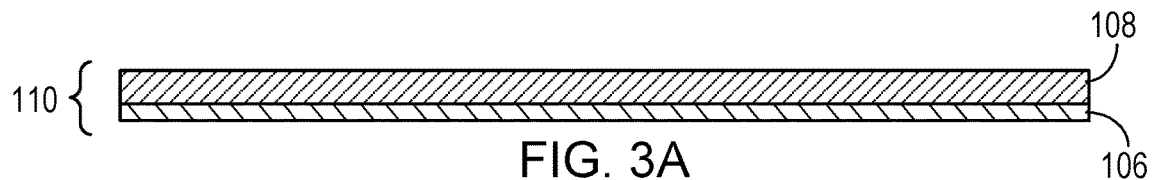
Figure 3B:
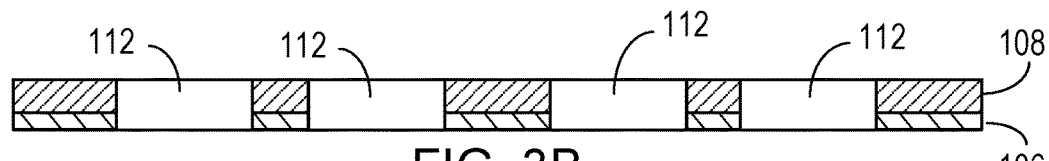
Figure 3C:
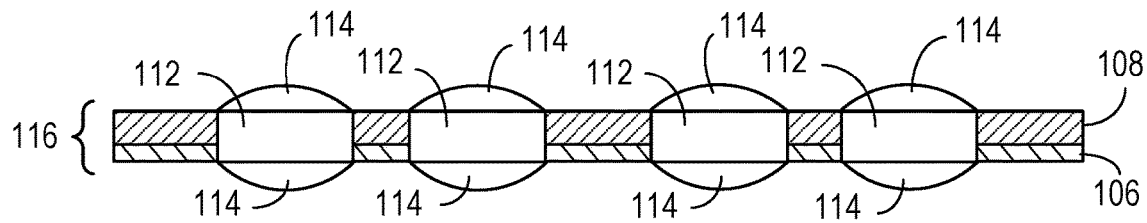

In addition to the foregoing fabrication steps, an optics wafer that includes passive optical elements (e.g., lenses) on transparent portions of the optics wafer is prepared. FIGS. 3A-3C illustrate a technique for fabricating such an optics wafer. As shown in FIG. 3A, a thin coating 106 of a non-transparent material (e.g., metal or polymer) is provided over a surface of a wafer 108 composed, for example, of a PCB, polymer or ceramic material to form a composite substrate 110. As indicated by FIG. 3B, openings are formed in the composite substrate 110 and are filled with an optically transmissive material (e.g., a plastic that is transparent to wavelength(s) of light emitted by the device 22A and detectable by the device 22B) to form transmissive windows 112. Next, passive optical element (e.g., lenses) 114 are formed on one (or both) surfaces of each transmissive region 112 (FIG. 3C). The lenses 114 can be formed on the transmissive regions 112, for example, by a replication technique. The result is an optics wafer 116 that includes passive optical elements 114 on transmissive regions 112 of the optics wafer, where the transmissive regions 112 are surrounded laterally by non-transparent sections composed of a thin coating 106 of a non-transparent material (e.g., a metal or polymer) on a thicker layer 108 of PCB, polymer or ceramic material. In some implementations, passive optical elements can be replicated directly into openings in the composite substrate 110.

Figure 4:
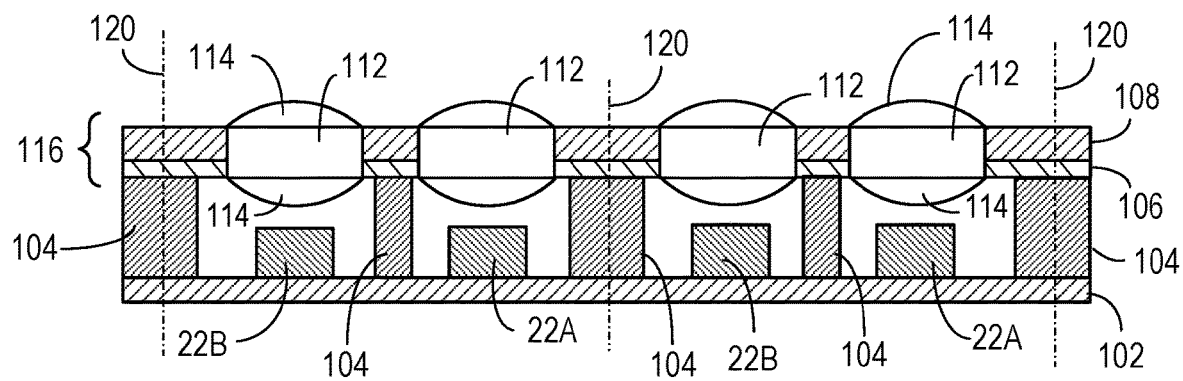

Next, as illustrated in FIG. 4, the optics wafer 116 (which may be referred to as a cover wafer) is attached to the top of the spacer wafer 104 such that the spacer wafer 104 is sandwiched between the optics wafer 116 and the PCB support wafer 102. In some implementations, a baffle wafer, which can be provided as a separate wafer, also is attached on top of the optics wafer 116. Alternatively, baffle features can be formed on the top surface of the optics wafer 116, for example, by a vacuum injection technique. The wafers can be held together, for example, by an adhesive. The result is a wafer stack 118, which can be separated (e.g., by dicing) along lines 120 into individual modules like the module 20 of FIG. 1.

Figure 5:
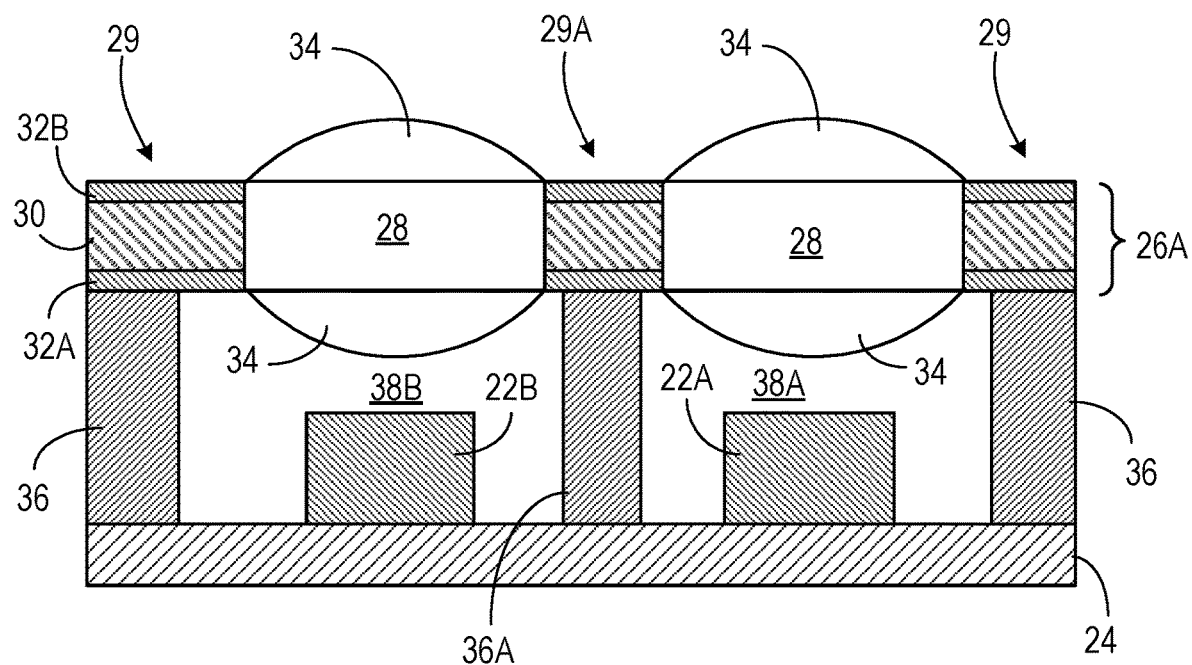
FIG. 5 illustrates another example of an optoelectronic module according to the invention.

In the illustrated module 20 of FIG. 1, the cover 26 includes a thin coating 32 on the device-side of the layer 30. In other implementations, the coating 32 can be disposed on the opposite (i.e., outer) side of the layer 30. As also mentioned above, in some implementations, a thin coating of a non-transparent material is provided on both sides of the layer 30. FIG. 5 illustrates an example of such a module 20A.

Figure 6A:
FIGS. 6A-6D illustrates steps in a wafer-level fabrication process for making modules as shown in FIG. 5.
Figure 6B:
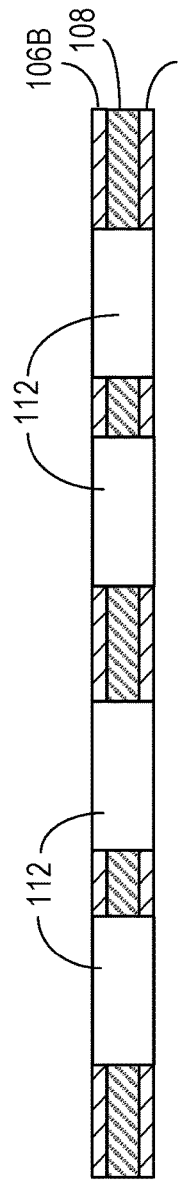
Figure 6C:
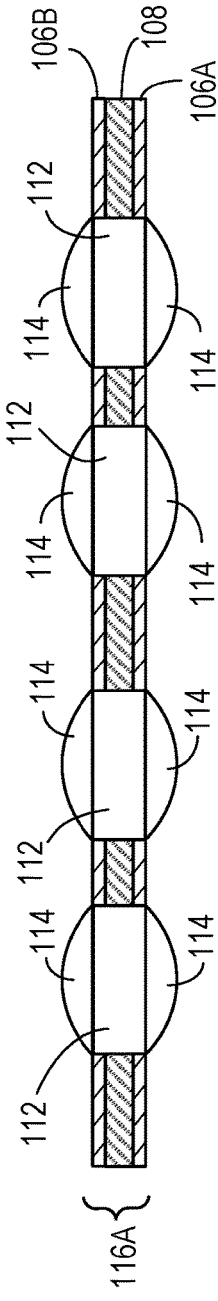
Figure 6D:
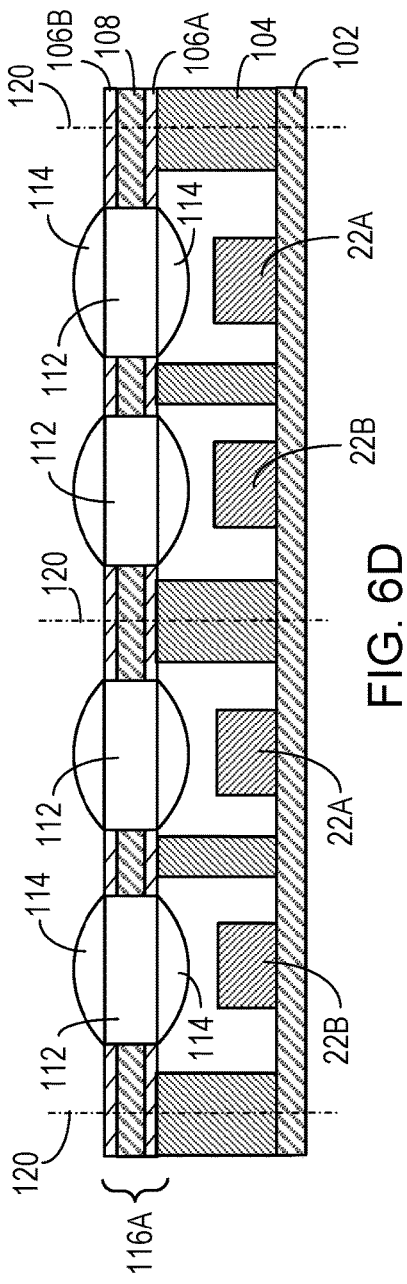

The module 20A is similar to the module 20 of FIG. 1, except that the cover 26A includes a first coating 32A of a non-transparent material (e.g., a metal or polymer) on the device-side of the layer 30 and a second coating 32B on the outer side of the layer 30. FIGS. 6A-6D illustrate fabrication steps for making multiple modules 20A as part of a wafer-level process. FIGS. 6A-6C show steps for making an optics wafer 116A and are similar, respectively, to FIGS. 3A-3C, except that thin coatings 106A, 106B of a non-transparent material (e.g., metal or polymer) are provided over both surfaces of a wafer 108 composed, for example, of a PCB, polymer or ceramic material to form a composite substrate 110A. The coatings 106A, 106B can be composed of the same or different non-transparent materials. The transmissive windows 112 and lenses 114 are provided to form the optics wafer 116A (FIG. 6C). Then, as illustrated in FIG. 6D, the optics wafer 116A is attached to the top of the spacer wafer 104 such that the spacer wafer 104 is sandwiched between the optics wafer 116A and the PCB support wafer 102. The resulting wafer stack then can be separated (e.g., by dicing) to form individual modules like the module 20A of FIG. 5.

Figure 7:
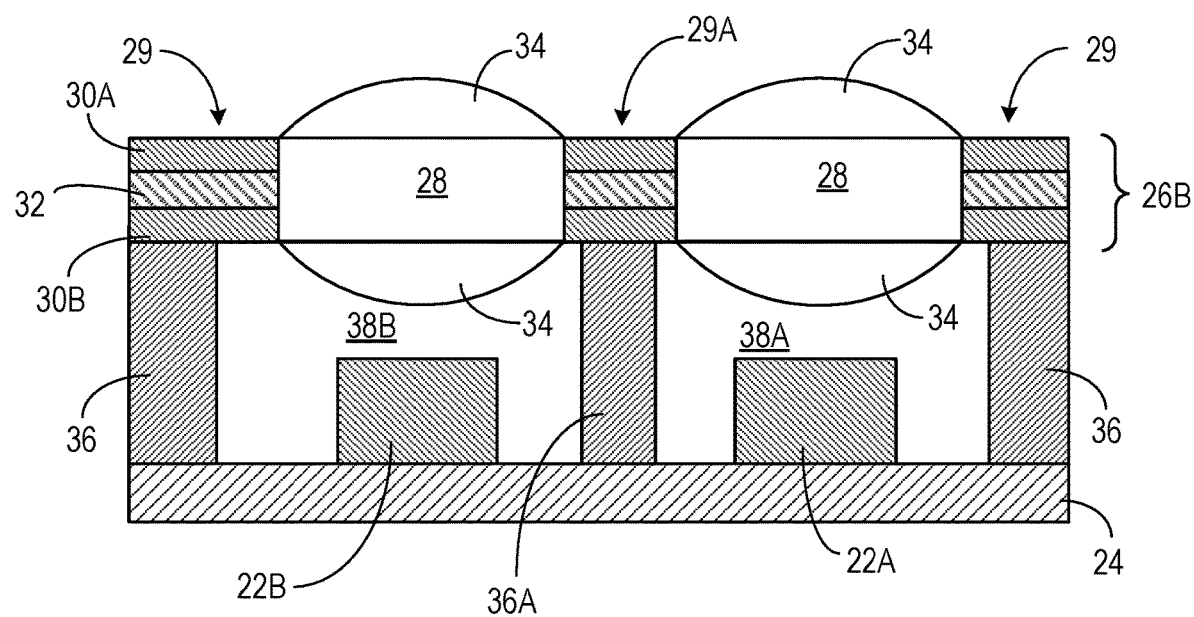
FIG. 7 illustrates a further example of an optoelectronic module according to the invention.

In the foregoing examples, each of the coatings 32, 32A, 32B is provided on an outer surface of the layer 30. In other implementations, a thin coating 32 of non-transparent material (e.g., metal or polymer) can be sandwiched between two PCB, polymer or ceramic layers 30A, 30B (see the module 20B of FIG. 7). In some cases, the two layers 30A, 30B are composed of the same material, whereas in other implementations, they can be composed of different materials.

FIGS. 8A-8D illustrate fabrication steps for making multiple modules 20B as part of a wafer-level process. FIGS. 8A-8C show steps for making an optics wafer 116B and are similar, respectively, to FIGS. 3A-3C, except that a thin coating 106 of a non-transparent material (e.g., metal or polymer) is sandwiched between two wafers 108A, 108B each of which is composed, for example, of a PCB, polymer or ceramic material to form a composite substrate 110B. The wafers 108A, 108B can be composed of the same or different materials. The transmissive windows 112 and lenses 114 are provided to form the optics wafer 116B (FIG. 8C). Then, as illustrated in FIG. 8D, the optics wafer 116B is attached to the top of the spacer wafer 104 such that the spacer wafer 104 is sandwiched between the optics wafer 116B and the PCB support wafer 102. The resulting wafer stack then can be separated (e.g., by dicing) to form individual modules like the module 20B of FIG. 7.

As used in this disclosure, the terms "transparent" and "non-transparent" are made with reference to wavelength(s) of light in the visible and/or non-visible portions (e.g., infra-red) of the spectrum emitted by the light emitting element or detectable by light detecting element in the optoelectronic devices. Thus, for example, if a particular feature of the module is non-transparent, the feature is substantially non-transparent to the particular wavelength(s) of light emitted by or detectable by the light emitting or light detecting elements in the optoelectronic device. The particular feature may, however, be transparent or partially transparent with respect to other wavelengths.

Various modules and fabrication techniques for making the modules are described here. In some implementations, the modules can be substantially light-tight (i.e., allowing very little, if any, stray light to enter the module and reducing the amount of optical cross-talk between the emission and detection channels 38A, 38B. Further, the modules can have very small dimensions (e.g., about 2.0 mm (length)×2.3 mm (width)×0.75 mm (height)), including a relatively small overall height.

The foregoing implementations are intended as examples, and various modifications will be readily apparent to one of ordinary skill. Accordingly, other implementations are within the scope of the claims.

What is claimed is:

1. A wafer-level fabrication method for making a plurality of optoelectronic modules, the method comprising:
    providing a support wafer on which are mounted a plurality of optoelectronic devices each of which is arranged to emit or detect light at a particular one or more wavelengths;
    providing an optics wafer that includes optically transmissive portions surrounded laterally by sections composed of a non-transparent PCB, polymer, or ceramic material, wherein the optics wafer includes a non-transparent coating disposed directly on a surface of the non-transparent PCB, polymer, or ceramic material, wherein the surface is parallel to the support wafer, wherein the non-transparent coating is composed of a material different from the non-transparent PCB, polymer, or ceramic material, wherein each of the transmissive portions including a respective passive optical element on its surface, and wherein a combined thickness of the coating and the non-transparent PCB, polymer, or ceramic material has a thickness in a range of 100-150 μm and the coating has a thickness of less than 20 μm; and
    attaching the support to the optics wafer by way of a spacer to form a wafer stack.

2. The method of claim 1 further including separating the wafer stack into multiple optoelectronic modules each of which includes a light emitting channel and a light detecting channel.

3. The method of claim 1 wherein the coating is a metal or polymer.

4. The method of claim 1 wherein opposite surfaces of the PCB, polymer, or ceramic material include a non-transparent material coating thereon.

5. The method of claim 1 wherein the coating has a thickness in a range of 5-15 μm.

6. The method of claim 1 wherein the coating has a thickness greater than 0.5 μm.

* * * * *